US010827105B1

(12) United States Patent
Li et al.

(10) Patent No.: US 10,827,105 B1
(45) Date of Patent: Nov. 3, 2020

(54) LENS MODULE AND ELECTRONIC DEVICE USING THE LENS MODULE

(71) Applicant: TRIPLE WIN TECHNOLOGY(SHENZHEN) CO. LTD., Shenzhen (CN)

(72) Inventors: Kun Li, Guangdong (CN); Shin-Wen Chen, New Taipei (TW); Xiao-Mei Ma, Guangdong (CN); Long-Fei Zhang, Guangdong (CN)

(73) Assignee: TRIPLE WIN TECHNOLOGY (SHENZHEN) CO. LTD., Shenzhen (CN)

( * ) Notice: Subject to any disclaimer, the term of this patent is extended or adjusted under 35 U.S.C. 154(b) by 0 days.

(21) Appl. No.: 16/539,037

(22) Filed: Aug. 13, 2019

(30) Foreign Application Priority Data

Jun. 28, 2019 (CN) .................... 2019 2 1014213 U (51) Int. Cl.
*H04N 5/225* (2006.01)
*G02B 7/08* (2006.01)
*H05K 1/18* (2006.01)

(52) U.S. Cl.
CPC ............. *H04N 5/2254* (2013.01); *G02B 7/08* (2013.01); *H04N 5/2252* (2013.01); *H04N 5/2257* (2013.01); *H05K 1/183* (2013.01); *G03B 2217/002* (2013.01)

(58) Field of Classification Search
None
See application file for complete search history.

(56) References Cited

U.S. PATENT DOCUMENTS

| 9,160,908 | B2* | 10/2015 | Mori ..................... H04N 5/2252 |
| 10,129,443 | B2* | 11/2018 | Shiraishi ................ G03B 17/02 |
| 10,288,831 | B2* | 5/2019 | Takahashi .............. G02B 7/021 |
| 10,558,108 | B2* | 2/2020 | Joo ......................... H05K 1/028 |
| 2008/0131112 | A1* | 6/2008 | Aoki .................... H04N 5/2257 396/429 |
| 2008/0316623 | A1* | 12/2008 | Aoki .................... G02B 13/001 359/823 |
| 2011/0279675 | A1* | 11/2011 | Mano ................... G02B 13/001 348/148 |
| 2015/0077840 | A1* | 3/2015 | Kim ......................... G02B 7/08 359/355 |
| 2017/0310861 | A1* | 10/2017 | Wang ..................... H04N 5/247 |
| 2018/0219987 | A1* | 8/2018 | Pantel ................... G06F 1/1637 |
| 2019/0170920 | A1* | 6/2019 | Park ....................... G02B 7/022 |
| 2019/0222729 | A1* | 7/2019 | Yoshikawa ............ G03B 17/02 |
| 2020/0084310 | A1* | 3/2020 | Keen ................... H01M 2/1022 |

* cited by examiner

*Primary Examiner* — James M Hannett
(74) *Attorney, Agent, or Firm* — ScienBiziP, P.C.

(57) ABSTRACT

A less conspicuous lens module able to approach closer to a corner of a display screen on an electronic device includes a circuit board, a carrier, and a lens assembly. The circuit board includes a first hard board portion. The carrier is disposed on the first hard board portion, and the lens assembly is disposed on the carrier. The first hard board portion, the carrier, and the lens assembly all have a cutaway structure at their edges. The cutaway structures of the first hard board portion, the carrier, and the lens assembly are consistent in shape and size and are aligned with each other. An electronic device using such a lens module is also provided.

17 Claims, 8 Drawing Sheets

LENS MODULE AND ELECTRONIC DEVICE USING THE LENS MODULE

FIELD

The subject matter herein generally relates to imaging devices in electronic devices.

BACKGROUND

Smart devices such as mobile phones with "all screen" or "infinity display" are popular. Among the "all screen" or "infinity display" smart devices, the "notched-screen" smart devices are more attractive because the "notched-display" has a high screen-to-body ratio.

However, the notch of the "notched-screen" for the front-facing camera is far away from any corner of a smart device, which not only affects the screen ratio but also affects the aesthetics.

Therefore, there is room for improvement.

BRIEF DESCRIPTION OF THE DRAWINGS

Implementations of the present technology will now be described, by way of embodiments, with reference to the attached figures.

DETAILED DESCRIPTION

The present disclosure is made in conjunction with the accompanying drawings. Specific embodiments of the present disclosure are described.

In the following description, when an element is described as being "fixed to" another element, the element can be fixed to the another element with or without intermediate elements. When an element is described as "connecting" another element, the element can be connected to the other element with or without intermediate elements.

Without a given definition otherwise, all terms used have the same meaning as commonly understood by those skilled in the art. The term "and/or" means including any and all combinations of one or more of associated listed items. The terms "upper", "lower", "lower", "left", "right", and etc. are only used to indicate relative positional relationships of objects, while the terms "X-axis", "Y-axis", "Z-axis", and the like are used to describe relative positional relationships of objects. When an absolute position of an object is changed, the relative positional relationships between the object and other objects are also changed accordingly.

Figure 1:
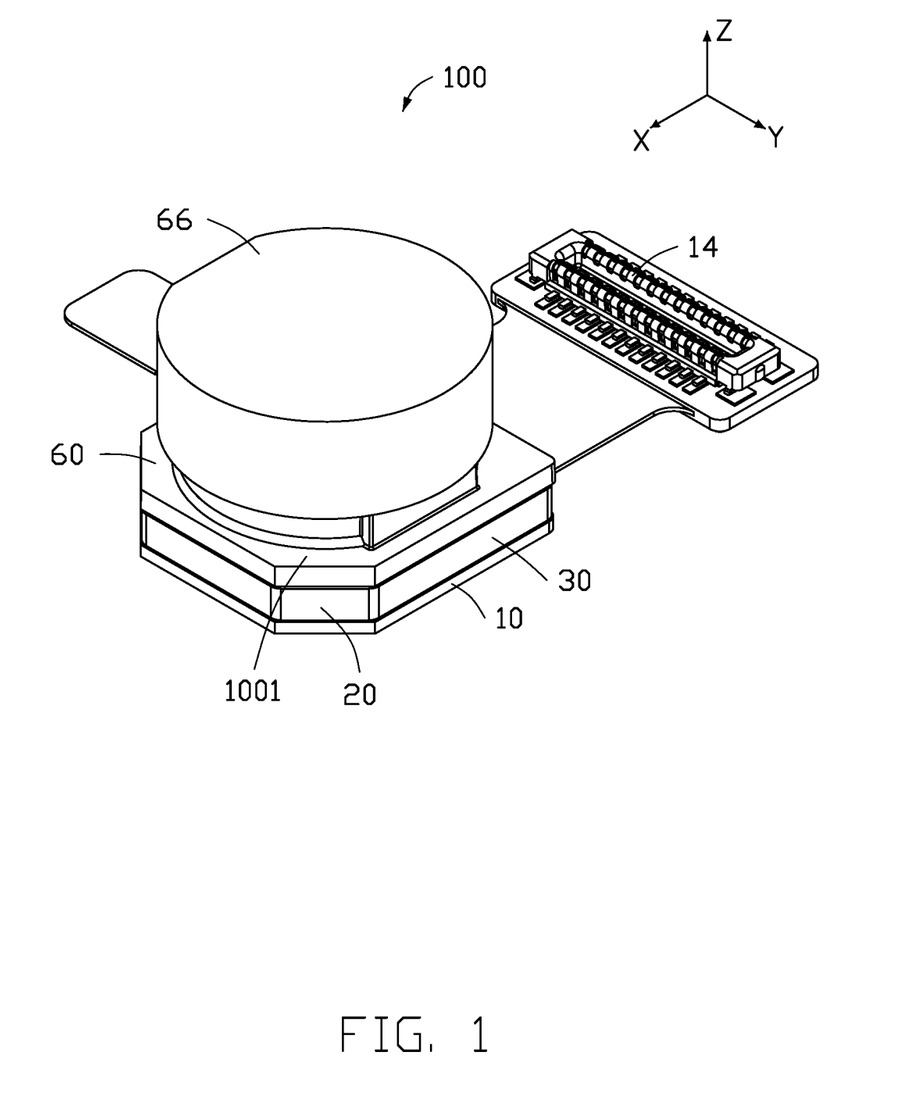
FIG. 1 is an isometric view of a lens module according to an embodiment of the present disclosure.

FIG. 1 is an isometric view of a lens module 100 according to an embodiment of the present disclosure. The lens module 100 includes a circuit board 10, a carrier 30, and a lens assembly 60.

Figure 2:
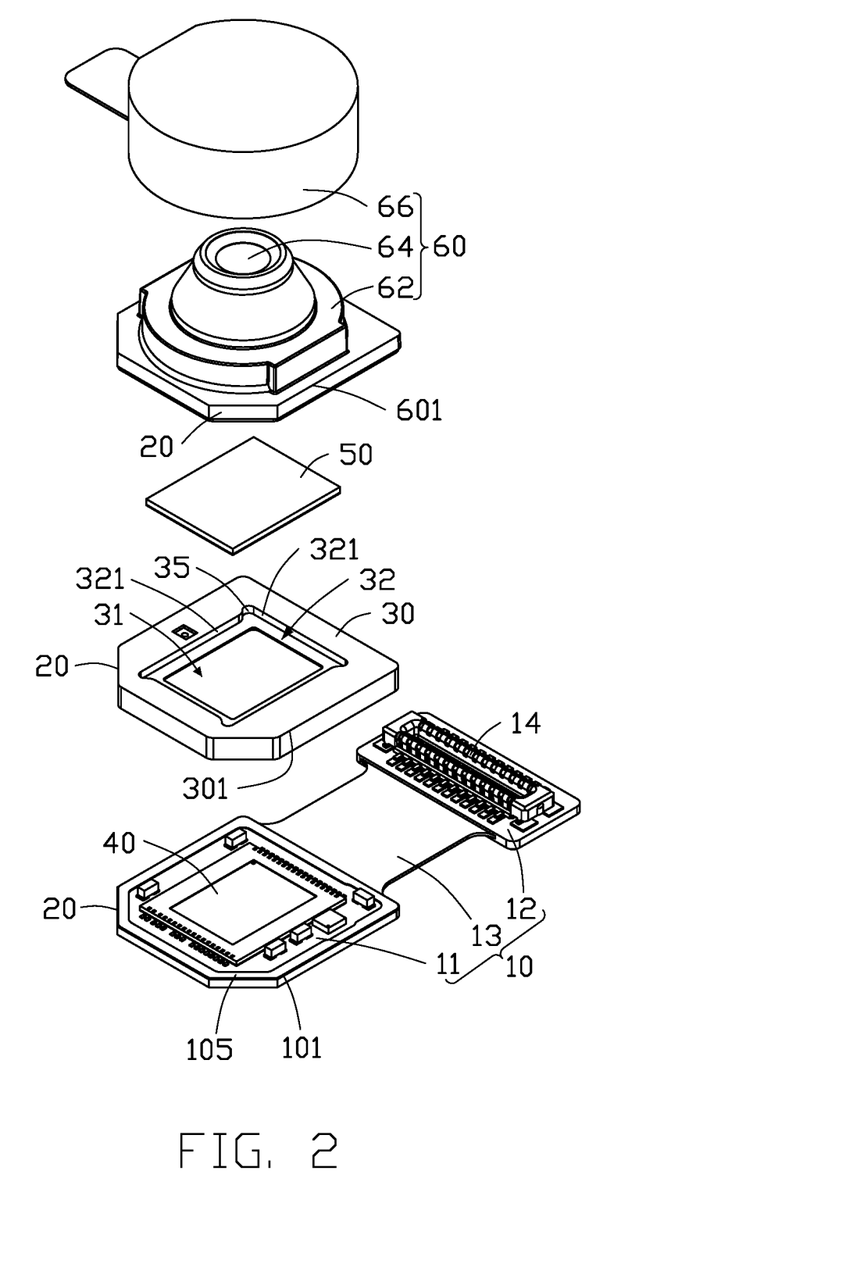
FIG. 2 is an exploded view of the lens module of FIG. 1.
Figure 3:
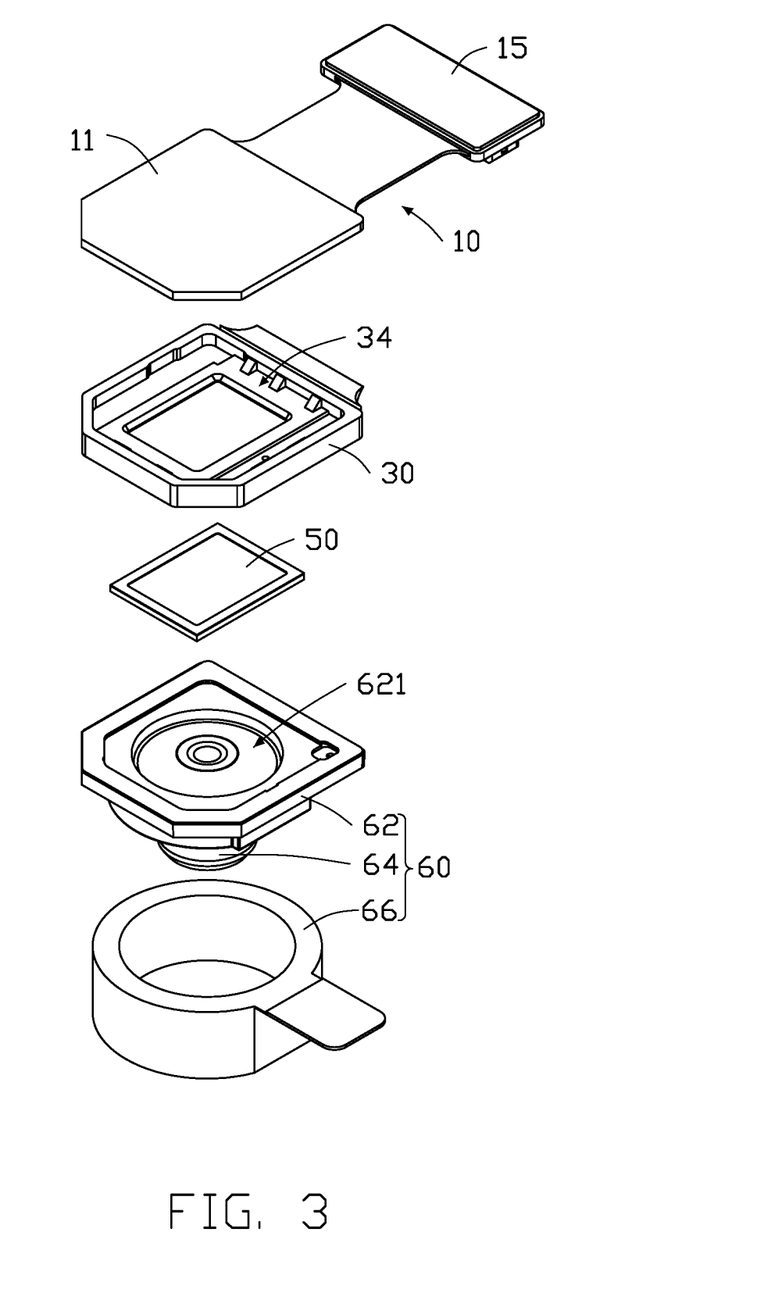
FIG. 3 is an exploded view of the lens module of FIG. 1 in another orientation.

Referring to FIGS. 2 and 3, the circuit board 10 can be a soft board, a hard board, or a board combining soft and hard. In the embodiment, the circuit board 10 is a combination board, and includes a first hard board portion 11, a second hard board portion 12, and a soft board portion 13 connected between the first hard board portion 11 and the second hard board portion 12. The carrier 30 is mounted on the first hard board portion 11. A connector 14 is mounted on the second hard board portion 12. The connector 14 and the carrier 30 are located on a same side of the circuit board 10. The connector 14 is used to transmit signals between the lens module 100 and other components of an electronic device 200 in which the lens module 100 is installed. The second hard board portion 12 carries a reinforcing plate 15 on a surface opposite to the connector 14. The reinforcing plate 15 enhances a hardness of the circuit board 10 and facilitates the assembly of the lens module 100. In another embodiment, the locations of the reinforcing plate 15 and the connector 14 are interchanged.

The terms "X-axis", "Y-axis", and "Z-axis" are used to describe locations of objects such as the first hard board portion 11, the second hard portion 12, and the soft board portion 13. Each of these axes is perpendicular to the others. In the embodiment, the first hard board portion 11, the soft board portion 13, and the second hard board portion 12 are sequentially connected along the X-axis. The Y-axis is parallel to and assigned to the first hard board portion 11 and is perpendicular to the X-axis. The X-axis and the Y-axis corporately define an XY plane. The Z-axis is perpendicular to the XY plane and the first hard board portion 11.

In the embodiment, the first hard board portion 11 has at least one cutaway structure 20 located at edges 101 of the first hard board portion 11. The cutaway structure 20 is recessed toward the inside of the first hard board portion 11 along the XY plane, thereby reducing an overall area of the circuit board 10 in the XY plane.

In the embodiment, the circuit board 10 carries components, such as sensors, metal wires, and etc. In the embodiment, the cutaway structure 20 is located at an end 103 of the first hard board portion 11 away from the second hard board portion 12. More particularly, the cutaway structure 20 is disposed at a corner 105 of the circuit board 10. When the lens module 100 is installed in an electronic device 200, the cutaway structure 20 corresponds to a corner of the electronic device 200, so that the lens module 100 can be mounted in the corner of the electronic device 200. In an embodiment, there is only one cutaway structure 20, and the cutaway structure 20 is disposed at a corner 105 of the circuit board 10. In another embodiment, there are two cutaway structures 20. The cutaway structures 20 are located at adjacent corners 105 of the circuit board 10. The cutaway structure or structures 20 can be any of a variety of shapes.

Figure 4:
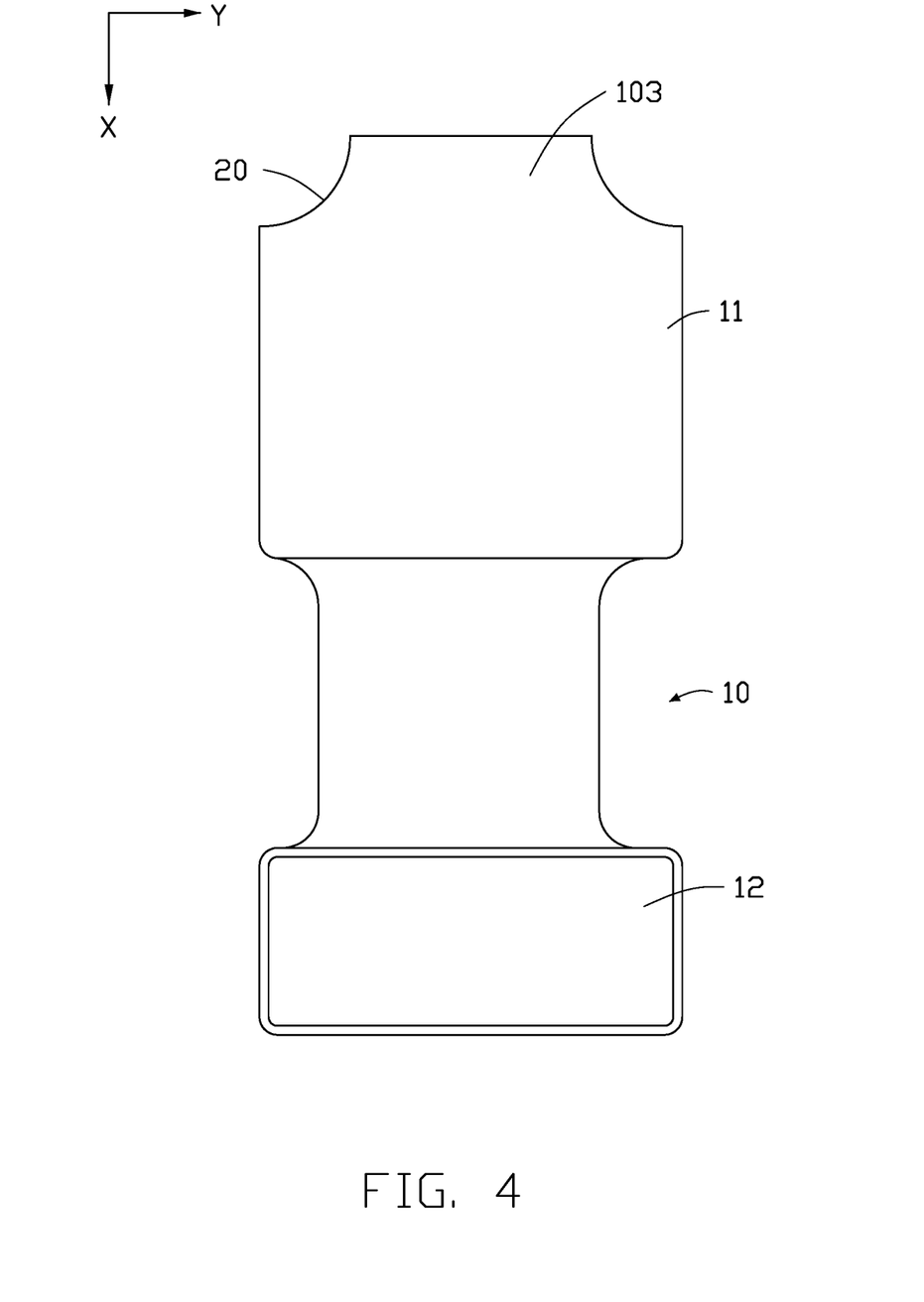
FIG. 4 is a schematic view of a circuit board in a first embodiment of the present disclosure.

Referring to FIG. 4, in a first embodiment, there are two cutaway structures located at adjacent corners 105 of the circuit board 10. Each cutaway structure 20 is an arc-shaped structure recessed inwardly along the XY plane. A fan shaped portion (not shown) of the corner 105 is cut away to form the recessed arc-shaped structure.

Figure 5:
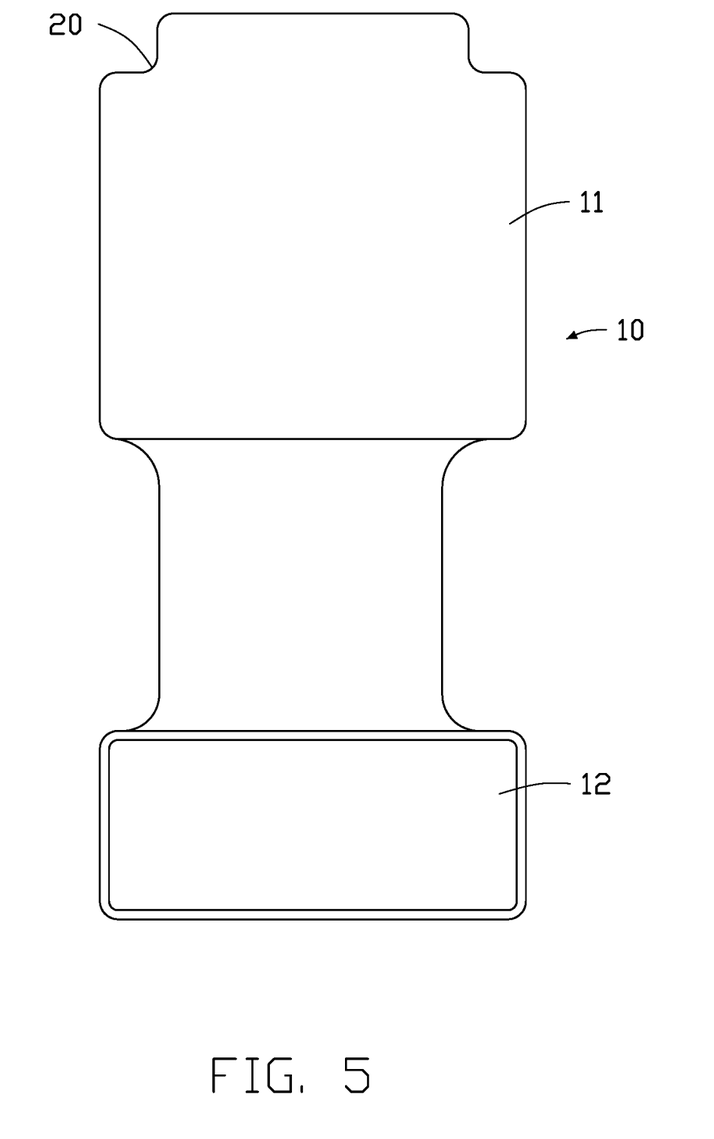
FIG. 5 is a schematic view of a circuit board in a second embodiment of the present disclosure.

Referring to FIG. 5, in a second embodiment, there are two cutaway structures 20 located at adjacent corners 105 of the circuit board 10. Each cutaway structure 20 is substantially a right-angle structure recessed inwardly along the XY plane. A rectangle shaped portion (not shown) of the corner 105 is cut away to form the right-angle structure.

Figure 6:
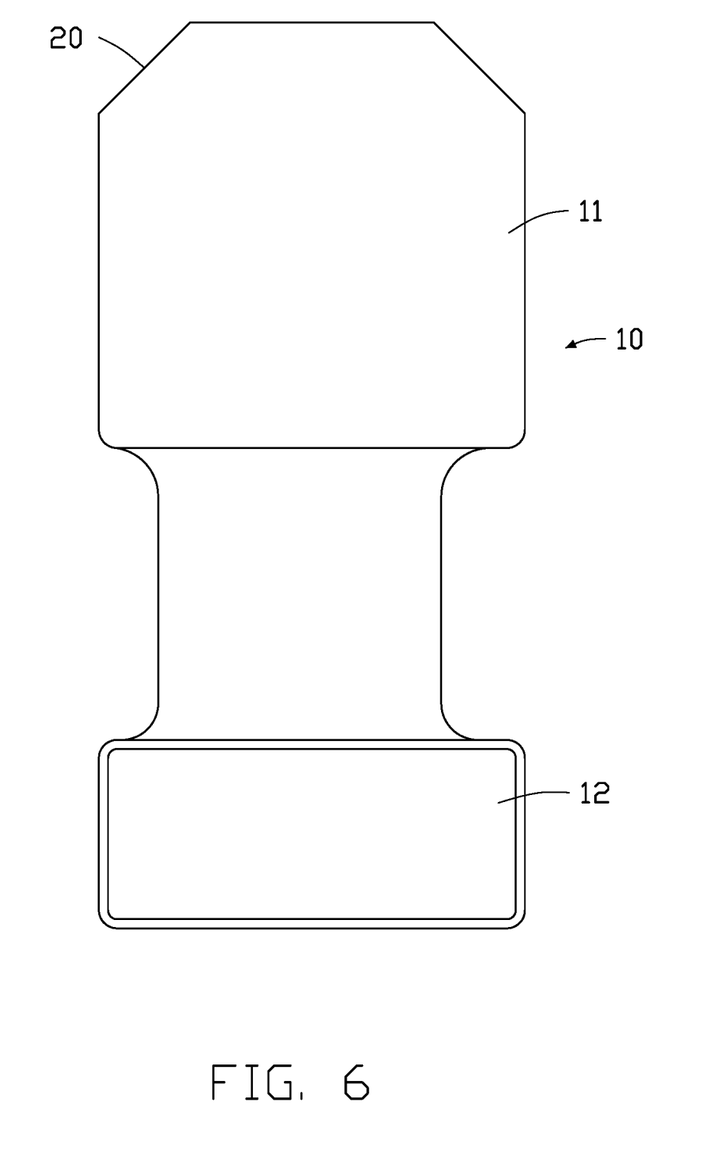
FIG. 6 is a schematic view of a circuit board in a third embodiment of the present disclosure.

Referring to FIG. 6, in a third embodiment, there are two cutaway structures 20 located at adjacent corners 105 of the circuit board 10. Each cutaway structure 20 is achieved by beveling. A triangular portion (not shown) of the corner 105 is cut away to form the beveled corner.

Figure 7:
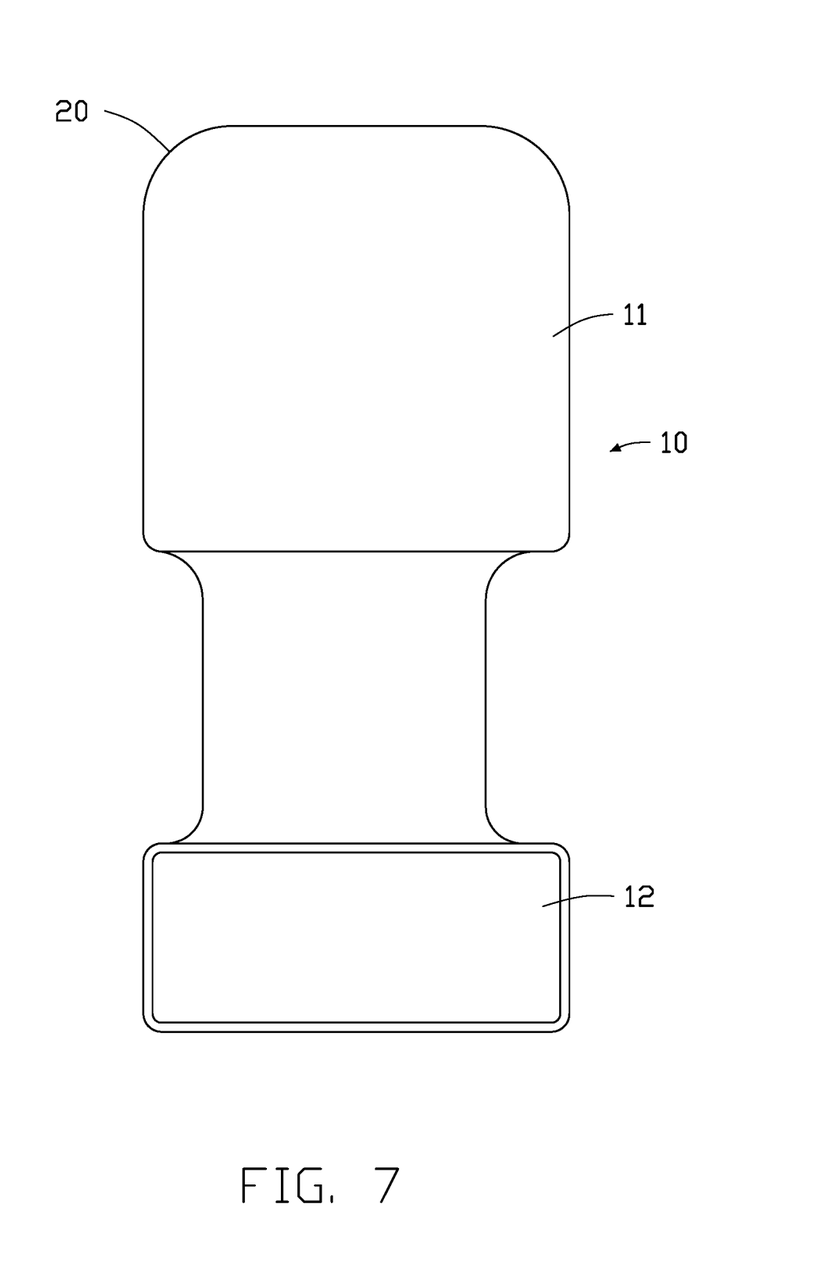
FIG. 7 is a schematic view of a circuit board in a fourth embodiment of the present disclosure.

Referring to FIG. 7, in a fourth embodiment, there are two cutaway structures 20 located at adjacent corners 105 of the circuit board 10. Each cutaway structure 20 leaves a rounded shape protruding outwardly along the XY plane. A portion (not shown) approximating a triangle is cut away to form a protruding arc-shaped structure of the cutaway structure 20.

It can be understood that the cutaway structure 20 can be any other shape with at least one portion cut away from the corner 105 to form the cutaway structure 20.

A photosensitive chip 40 is mounted on a surface of the first hard board portion 11 where the carrier 30 is located. In the embodiment, the shape of the photosensitive chip 40 is substantially rectangular.

The carrier 30 has a substantially hollow structure defining a through hole 31 extended along the Z-axis. The carrier 30 defines a first recess 32 surrounding the through hole. The first recess 32 is on the surface of the carrier 30 that is away from the circuit board 10 and extended along the Z-axis and effectively makes the through hole 31 into a stepped through hole. The filter 50 is received in the first recess 32 and spaced from the photosensitive chip 40. In the embodiment, the filter 50 is rectangular shaped. The carrier 30 further defines a second recess 34 opposite to the first recess 34 and surrounding the through hole 32 for receiving the photosensitive chip 20. The carrier 30 includes four inner walls 321 surrounding to define the first recess 32, a junction between two adjacent of the four inner walls 321 is recessed away from the through hole 31 to form a concave portion 35.

In the embodiment, an outer side of the carrier 30 has at least one cutaway structure 20 at edges 301 of the carrier 30. The cutaway structure 20 of the carrier 30 has a shape consistent with the shape of the cutaway structure 20 of the circuit board 10. The cutaway structure 20 of the carrier 30 is aligned with the cutaway structure 20 of the circuit board 10.

The lens assembly 60 includes a lens holder 62 and a lens unit 64. The lens holder 62 is disposed on the carrier 30 away from the circuit board 10. The lens holder 62 defines a receiving hole 621 for receiving the lens unit 64. The lens unit 64 and the lens holder 62 are assembled together or integrally formed. In the embodiment, the lens 64 and the lens holder 62 are integrally formed.

In the embodiment, an outer side of the lens holder 62 has at least one cutaway structure 20 located at edges 601 of the lens holder 62. The cutaway structure 20 of the lens holder 62 has a shape consistent with the shape of the cutaway structure 20 of the circuit board 10. The cutaway structure 20 of the lens holder 62 is aligned with the cutaway structure 20 of the circuit board 10. The circuit board 10, the carrier 30, and the lens holder 62 all have at least one cutaway structure 20, the lens module 100 having at least one cutaway structure 20 at a corner 101 of the lens module 100. The cutaway structure 20 is aligned with a corner 201 of electronic device 200, thereby the lens module 100 can be disposed at the corner 201 of the electronic device 200.

In the embodiment, the lens assembly 60 further includes a protective cover 66 mountable on the lens holder 62 for covering and protecting the lens unit 64.

Figure 8:
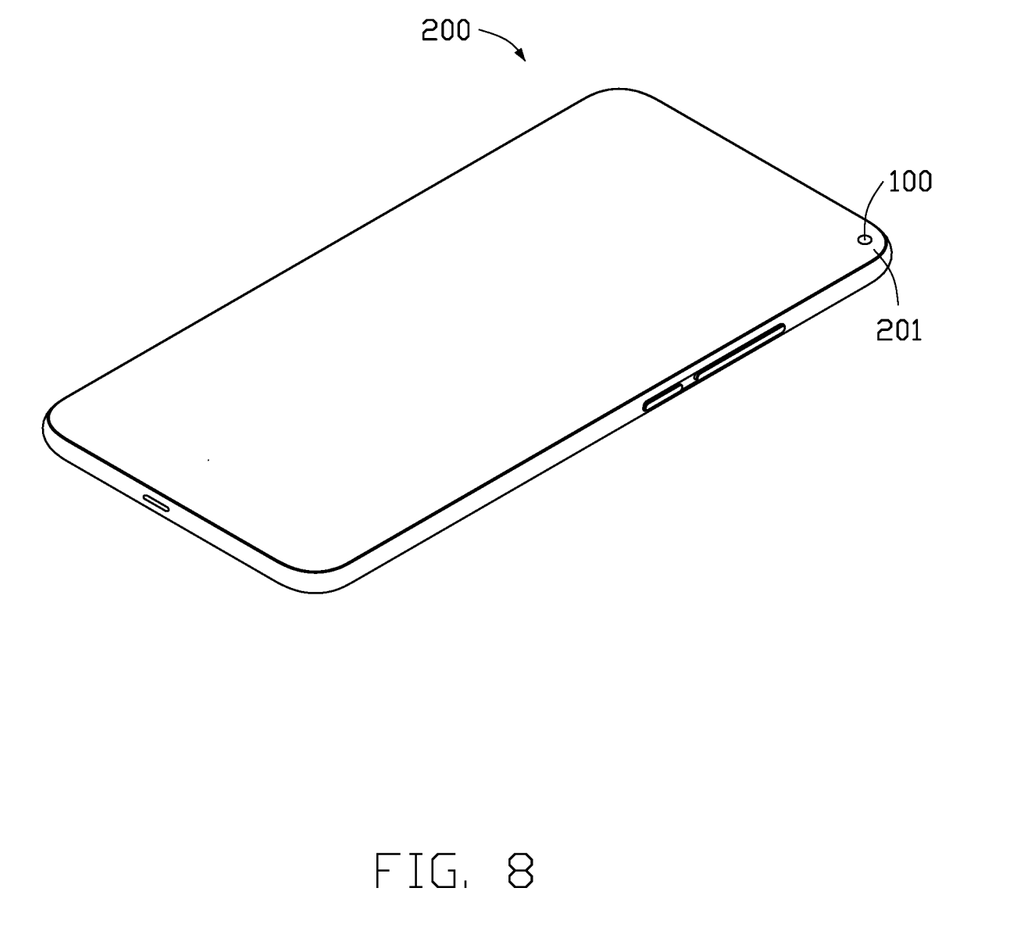
FIG. 8 is an isometric view of an electronic device in which the lens module of FIG. 1 is installed.

Referring to FIG. 8, the lens module 100 can be applied to various electronic devices 200 equipped with lens modules, such as mobile phones, wearable devices, computer devices, vehicles, or monitoring devices. In this embodiment, the lens module 100 is applied in a mobile phone. Specifically, the cutaway structure 20 of the lens module 100 is disposed at a corner of the mobile phone, thereby improving the screen-to-body ratio and the aesthetics of the mobile phone.

The circuit board 10, the carrier 30, and the lens assembly 60 of the lens module 100 disclosed all have a consistent cutaway structure 20 aligned with each other, thereby the lens module 100 can be disposed at a corner of an electronic device 200, achieving less of an interruption the display screen and improving aesthetics.

The embodiments shown and described above are only examples. Even though numerous characteristics and advantages of the present technology have been set forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims.

What is claimed is:

1. A lens module, comprising a circuit board, a carrier, and a lens assembly, wherein the circuit board comprises a first hard board portion, and the carrier is disposed on the first hard board portion, the lens assembly is disposed on the carrier, each of the first hard board portion, the carrier and the lens assembly comprises a cutaway structure located at edges of the first hard board portion, the carrier and the lens assembly correspondingly, and the cutaway structures of the first hard board portion, the carrier, and the lens assembly are consistent in shape and size and are aligned with each other, the carrier is a hollow structure defining a through hole, the carrier defines a first recess surrounding the through hole configured for receiving a filter, the carrier comprises four inner walls surrounding to define the first recess, a junction between two adjacent of the four inner walls is recessed away from the through hole to form a concave portion.

2. The lens module according to claim 1, wherein the cutaway structures are located in a corner of the lens module.

3. The lens module according to claim 2, wherein each of the first hard board portion, the carrier and the lens assembly comprises two cutaway structures respectively located in two adjacent corners of the lens module.

4. The lens module according to claim 1, wherein the cutaway structure is an arc-shaped structure recessed inwardly.

5. The lens module according to claim 1, wherein the cutaway structure is a right-angle structure recessed inwardly.

6. The lens module according to claim 1, wherein the cutaway structure is a beveled corner.

7. The lens module according to claim 1, wherein the cutaway structure is an arc-shaped structure protruding outwardly.

8. The lens module according to claim 1, wherein the lens assembly comprises a lens holder and a lens unit, the lens holder is disposed on the carrier away from the circuit board, the lens holder defines a receiving hole configured for receiving the lens unit, the lens unit and the lens holder are assembled together or integrally formed.

9. An electronic device comprising a lens module, wherein the lens module comprises a circuit board, a carrier, and a lens assembly, the circuit board comprises a first hard board portion, and the carrier is disposed on the first hard board portion, the lens assembly is disposed on the carrier, each of the first hard board portion, the carrier and the lens assembly comprises a cutaway structure located at edges of the first hard board portion, the carrier and the lens assembly correspondingly, and the cutaway structures of the first hard board portion, the carrier, and the lens assembly are consistent in shape and size and are aligned with each other, the carrier is a hollow structure defining a through hole, the carrier defines a first recess surrounding the through hole configured for receiving a filter, the carrier comprises four inner walls surrounding to define the first recess, a junction between two adjacent of the four inner walls is recessed away from the through hole to form a concave portion.

10. The electronic device according to claim 9, wherein the cutaway structures are located in a corner of the lens module.

11. The electronic device according to claim 10, wherein each of the first hard board portion, the carrier and the lens assembly comprises two cutaway structures respectively located in two adjacent corners of the lens module.

12. The electronic device according to claim 9, wherein the cutaway structure is an arc-shaped structure recessed inwardly.

13. The electronic device according to claim 9, wherein the cutaway structure is a right-angle structure recessed inwardly.

14. The electronic device according to claim 9, wherein the cutaway structure is a beveled corner.

15. The electronic device according to claim 9, wherein the cutaway structure is an arc-shaped structure protruding outwardly.

16. The electronic device according to claim 9, wherein the cutaway structures of the first hard board portion, the carrier and the lens assembly are aligned with a corner of the electronic device and the lens module is located at the corner of the electronic device.

17. The electronic device according to claim 9, wherein the lens assembly comprises a lens holder and a lens unit, the lens holder is disposed on the carrier away from the circuit board, the lens holder defines a receiving configured for receiving the lens unit, the lens unit and the lens holder are assembled together or integrally formed.

\* \* \* \* \*